United States Patent [19]

Dobbelaere

[11] Patent Number: 5,455,521
[45] Date of Patent: Oct. 3, 1995

[54] SELF-TIMED INTERCONNECT SPEED-UP CIRCUIT

[75] Inventor: Ivo J. Dobbelaere, Palo Alto, Calif.

[73] Assignee: The Board of Trustees of the Leland Stanford Junior University, Stanford, Calif.

[21] Appl. No.: 142,901

[22] Filed: Oct. 22, 1993

[51] Int. Cl.$^6$ .................................................. H03K 17/04
[52] U.S. Cl. ............................................. 376/17; 326/86
[58] Field of Search ..................... 307/443, 451, 307/452, 475, 264, 360, 362; 326/17, 86, 121

[56] References Cited

U.S. PATENT DOCUMENTS

| | | | |
|---|---|---|---|
| 4,446,382 | 5/1984 | Moore et al. | 307/443 X |
| 4,498,021 | 2/1985 | Uya | 302/443 |
| 4,598,216 | 7/1986 | Lauffer et al. | 307/443 |
| 4,621,202 | 11/1986 | Pumo | 307/443 X |
| 4,763,023 | 8/1988 | Spence | 307/451 X |
| 4,829,199 | 5/1989 | Prater | 307/451 X |
| 5,202,593 | 4/1993 | Huang et al. | 307/475 |

OTHER PUBLICATIONS

Glasser, L. A., and Dobberpuhl, D. W., *The Design and Analysis of VLSI Circuits*, c. 1985, Addison–Wesley, Reading, Mass., pp. 419–420.

Ogura, T., et al., "A 20-kbit Associative Memory LSI for Artificial Intelligence Machines", IEEE Journal of Solid State Circuits, V. 24, No. 4, Aug. 4, 1989, p. 1018.

*Primary Examiner*—David R. Hudspeth

[57] ABSTRACT

A circuit style, which may be employed in fast, area-efficient, flexible programmable interconnect architectures, or in logic circuits, is disclosed. In one embodiment, a plurality of internally delayed logic circuits, each having a single network node, is connected to the intermediate nodes of a programmable interconnect architecture. Each speed-up circuit monitors the logic level on the network node. When a circuit detects a substantial change in logic level, it temporarily enforces that change by connecting its network node to either the high or the low logic level. Thus, on each node, a low-impedance enhancement of the signal driving the node temporarily appears. This causes the potential on neighboring nodes, connected through conducting programmable switches, to change towards the new level, and their speed-up circuits in turn temporarily enforce the new level. Thus, a forced high-to-low or low-to-high level change on a node quickly propagates to its connected nodes.

8 Claims, 8 Drawing Sheets

NODE POTENTIALS VERSUS TIME

SELF-TIMED INTERCONNECT SPEED-UP CIRCUIT

CROSS-REFERENCE TO RELATED APPLICATION

U.S. patent application Ser. No. 08/142900, "DYNAMIC LOGIC INTERCONNECT SPEED-UP CIRCUIT," filed concurrently herewith, now abandoned, is incorporated herein by reference.

FIELD OF THE INVENTION

The present invention relates to integrated circuit (IC) technology. More specifically, the present invention pertains to fast circuits for realizing programmable interconnect architectures among circuitry on one integrated circuit, and among circuitry on different integrated circuits.

BACKGROUND OF THE INVENTION

Programmable interconnect architectures are used in user-programmable arrays of logic cells, also referred to as "Field Programmable Gate Arrays (FPGAs)," as well as in dedicated programmable interconnect chips, microprocessors, digital signal processor cores, etc.

Such programmable interconnect architectures typically consist of a network of conductive nodes, programmable passive switches, and programmable or non-programmable repeater circuits. An interconnection from one conductive node to another is obtained by programming the intermediate passive switches to be conducting, and by programming each repeater circuit to be propagating and enhancing the signal from one of its terminals to another. The signal enhancement through a repeater circuit consists of driving the output with a low-impedance version of the logic signal at the input.

The repeater circuits are necessary to limit the propagation delay and the signal rise/fall time in cases where the interconnection contains many passive switches in sequence. The delay through such a network can be approximately modeled as an "RC-chain," and hence both propagation delay and rise/fall time are roughly proportional to the square of the number of switches traversed. The network of switches and repeaters can be optimized to have minimum worst case propagation delay, and an acceptable signal rise/fall time, under a given layout area constraint. The optimization consists of finding the best combination of repeater circuit sizing, switch sizing, and switch-to-repeater ratio. The switch-to-repeater ratio is the worst case number of switches between repeaters in the path of an interconnection.

The design trade-offs may be explained as follows. As the switches are made larger, their on-resistance becomes smaller, but the capacitance added to the conductive nodes becomes larger. Second order factors such as fringe capacitance and the non-linear voltage dependence of the on-resistance of the switches, as well as the size of the repeater, must be considered to find the best switch size. Placing repeaters at every conductive node is possible if there is no area constraint. However, repeaters have an inherent propagation delay. When placed at every node, the repeater propagation delay dominates the total propagation delay.

In a realistic programmable interconnect architecture, a layout area constraint must be considered. In bi-directional, two-dimensional programmable interconnect architectures, such as the ones used in FPGAs, the repeater area is very large: the bi-directionality and the two-dimensionality may require a redundancy of a factor two or larger in the number of three-state buffers: not more than half the buffers, but usually fewer, are actually used when programmed. The fact that three-state buffers are employed implies large circuits and additional area overhead because of the need for memory cells in the repeaters.

In conclusion, the area and performance of programmable bi-directional interconnect architectures may be improved efficiently by employing a bi-directional repeater circuit with a small propagation delay and a small area.

*The Design and Analysis of VLSI Circuits* (L. Glasser and D. Dobberpuhl, Addison-Wesley Publishing Company, Reading, Mass., 1985, p. 420, FIG. 8.5) shows a carry chain employing a precharge PMOS transistor and an evaluation circuit with feedback on each intermediate node of the carry chain. However, that circuit is directed to providing a short propagation delay in a dynamic logic unidirectional carry chain. It does not address the use of a complementary pair of evaluation circuits for the speed-up of both high-to-low and low-to-high transitions. Furthermore, it does not address the use of a delay circuit in order to obtain a circuit that works independent of a clock. Finally, it does not address the use of such a circuit in a programmable interconnect architecture, and it does not address the use of such a precharge and evaluation circuit for bi-directional signal propagation.

Journal article "A 20-kbit Associative Memory LSI for Artificial Intelligence Machines" by T. Ogura et al., in the IEEE Journal of Solid State Circuits, Vol. 24, No. 4, August, 1989, p. 1018, FIG. 6, shows an accelerator circuit employing feedback, using a PMOS transistor as a detection circuit and an NMOS transistor as an evaluation circuit. However, that circuit is different from the current invention, and is directed to speeding up the discharging of a match line in a content addressable memory cell, in a dynamic logic circuit. It does not address the use of a complementary pair of evaluation circuits for the speed-up of both high-to-low and low-to-high transitions. Furthermore, it does not address the use of a delay circuit in order to obtain a circuit that works independent of a clock. Finally, it does not address the use of such a circuit in a programmable interconnect architecture, and it does not address the use of such a precharge and evaluation circuit for bi-directional signal propagation.

U.S. Pat. No. 4,498,021 to M. Uya discloses a booster for transmitting digital signals. However, that circuit is directed to speeding up transitions on a single bus wire, and does not address the problem of bi-directional interconnections through programmable switches with an appreciable resistance. In addition, the circuit of Uya uses separate threshold voltages to turn on and off the drivers of the booster circuits, instead of using a predetermined delay. This not only results in additional circuitry, but results in less reliable operation compared to the current invention. More in particular, the use of Uya's circuit at intermediate nodes of a network of programmable switches is less reliable since the booster circuit is turned off when the voltage at the node reaches the threshold voltage for deactivation, regardless of the potential at the node attached to the subsequent booster circuit. In the case where a rising transition is propagated, if a first booster circuit then is turned off prematurely and fails to bring the node of a subsequent booster circuit past the activation threshold voltage, the charge stored in the further nodes will cause the node of the first booster to drop back, below the activation threshold voltage for the opposite transition, and initiate oscillations. Since the resistances and capacitances are relatively large in practical implementations of such networks using MOS transistors, and since it is impractical to provide detection circuits with threshold voltages close to the power supply or the ground level in MOS technology, Uya's circuit is not guaranteed to operate correctly in such a programmable interconnect architecture. In the present invention, on the other hand, the designer can choose the predetermined delay to be long enough such that subsequent speed-up circuits are guaranteed to be activated.

U.S. Pat. No. 5,202,593 to T. Huang et al. discloses a bi-directional bus repeater that does not need a direction setting control signal. However, that circuit is directed to providing automatic sensing of the signal propagation direction in a bus repeater and does not provide the improvement in the rise/fall time of the input signal offered by the current invention, which has concurrently active drivers on both the input and output network nodes.

OBJECTS OF THE INVENTION

Accordingly, it is a principal object of the invention to provide a bi-directional repeater circuit with a smaller layout area and a smaller propagation delay than existing circuits, enabling the design of programmable interconnect architectures with smaller layout area and smaller propagation delays than existing architectures.

It is also a principal object of the invention to provide a speed-up circuit for static and dynamic logic circuits with a smaller layout area and a smaller propagation delay than existing circuits, that can be added to intermediate nodes of logic circuits in a modular fashion, and that is bi-directional.

It is another principal object of the invention to provide a two-terminal bi-directional repeater circuit with a smaller propagation delay than existing circuits, along with improved input signal rise/fall time characteristics, as a result of having active drivers on both input and output nodes concurrently.

It is an additional object of the invention to provide a circuit for placement along on-chip or off-chip electrical conductors, in order to improve the electrical behavior of the interconnection.

Other objects and features of the invention will become apparent to those skilled in the art in light of the following description and drawings of the preferred embodiment.

BRIEF DESCRIPTION OF THE INVENTION

In accordance with the present invention, a speed-up circuit for use in electrically programmable interconnect architectures is disclosed. In a programmable interconnect architecture consisting of a plurality of conductive nodes interconnected by programmable passive switches, this circuit acts as a bi-directional repeater with negligible added propagation delay, and with a minimal redundancy in the number of driver transistors, resulting in faster and more area efficient circuits.

In one embodiment, a plurality of internally delayed logic circuits, each having a single network node, is connected to the intermediate nodes of a programmable interconnect architecture. Initially, each circuit is in the stand-by state, in which it monitors the logic level on the network node. When a substantial change in logic level is detected from a low level towards a high level, the circuit temporarily switches to the charge state, in which it enforces the level change by connecting its network node to the high level. When a substantial change in logic level is detected from a high level to a low level, the circuit temporarily switches to the discharge state, in which it enforces the level change by connecting its network node to the low level. Thus, on each node, a low-impedance enhancement of the signal driving the node temporarily appears. This causes the potential on neighboring nodes, connected through conducting programmable switches, to change towards the new level, and their speed-up circuits in turn temporarily enforce the new level. Thus, a forced high-to-low or low-to-high level change on a node quickly propagates to its connected nodes. After a predetermined period of time, chosen long enough by the designer such that the subsequent speed-up circuit is certain to become activated, the speed-up circuit returns to the stand-by state.

The speed-up circuit consists of a pull-up circuit, a pull-down circuit, and a control circuit. In one implementation, the control circuit consists of a rising edge triggered monostable circuit and a falling edge triggered monostable circuit, with their inputs connected to the network node. The rising edge triggered monostable circuit temporarily turns on the pull-up circuit when its input detects a rising logic level. The falling edge triggered monostable circuit temporarily turns on the pull-down circuit when its input detects a failing logic level. In another implementation, the control signal for the pull-up circuit is obtained as the logical AND function of the signal on the network node and its delayed inverted version. The control signal for the pull-down circuit is obtained as the logical NOR function of the signal on the network node and its delayed inverted version. In a third implementation, two pull-up and two pull-down circuits are placed in series, respectively. The pull-down and pull-up circuits that have a current electrode connected to the network node both have a first control signal that is the inverse of the signal on the network node. The pull-down and pull-up circuits that have a current electrode connected to the power supply or to ground both have a second control signal that is the delayed inverted version of the first control signal.

Also according to the present invention, a bi-directional two-terminal bus repeater, compatible with static and dynamic logic, is disclosed. This bi-directional bus repeater has two terminals connected to intermediate nodes of a programmable interconnect architecture. The circuit is initially in the stand-by state, where it monitors the logic level on its terminals. When a substantial change in logic level is detected from a low level towards a high level on either one of the two terminals, the circuit temporarily switches to the charge state, in which it enforces the level change by connecting both its terminals to the high level. When a substantial change in logic level is detected from a high level to a low level on either one of the two terminals, the circuit temporarily switches to the discharge state, in which it enforces the level change by connecting both its terminals to the low level. Thus, a forced high-to-low or low-to-high level change on one of the terminals causes a low-impedance enhancement of that level change to temporarily appear on both nodes, thus improving the signal rise/fall time on the input node and quickly propagating the level change to the other node. After a predetermined period of time, the circuit returns to the stand-by state.

The bi-directional two-terminal bus repeater may be used in combination with the speed-up circuit. The bi-directional two-terminal bus repeater specifically performs better when the capacitive load of two neighboring nodes is substantially different. It also performs better for off-chip interconnections, where one such circuit is placed at each sending or receiving end of a multi-point inter-chip interconnection.

The invention may be used in combination with CMOS buffers.

No additional circuitry or programming of the programmable interconnect architecture is necessary to enable the propagation of a signal in the reverse direction: the circuits are inherently bi-directional.

DETAILED DESCRIPTION OF SPECIFIC EMBODIMENTS

Throughout this description, the same labels have been used for like elements.

Figure 1:
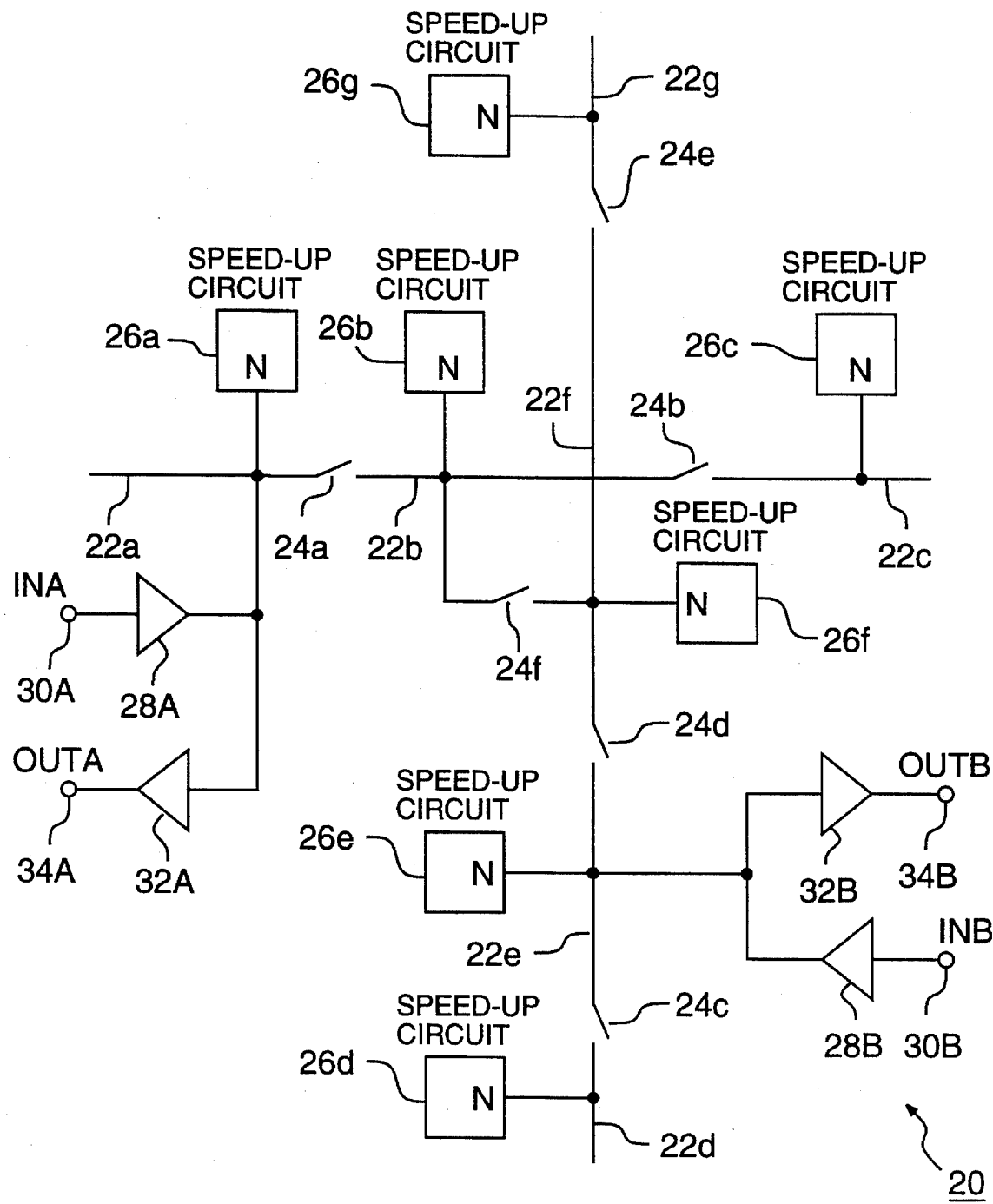
FIG. 1 is a block diagram of an illustrative embodiment of the present invention.

It is necessary to show an example of a programmable interconnect architecture in order to explain the self-timed interconnect speed-up circuit of the present invention. FIG. 1 depicts an illustrative embodiment of a programmable interconnect architecture 20 consisting of seven conductive nodes 22a–22g interconnected by six programmable switches 24a–24f, two buffers 25A and 25B for sending signals to programmable interconnect architecture 20, an input node 30A, also referred to as INA, an input node 30B, also referred to as INB, two buffers 32A and 32B for receiving signals from programmable interconnect architecture 20, an output node 34A, also referred to as OUTA, an output node 34B, also referred to as OUTB, and seven speed-up circuits 26a–26g according to the present invention. Speed-up circuits 26a–26g each have a network terminal N. For clarity, the connections of speed-up circuits 26a–26g to the positive supply VDD and to the ground node have been omitted in FIG. 1.

Figure 2:
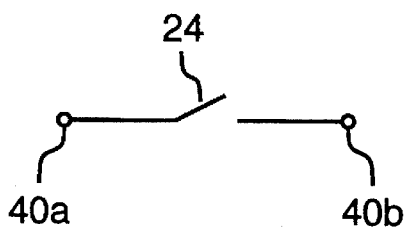
FIG. 2 shows a block diagram of the programmable bi-directional switch in FIG. 1.

FIG. 2 shows a block diagram of a programmable switch 24, having its two terminals connected to two nodes 40a and 40b, respectively. Programmable switch 24 has two programming states. In a first programming state, further referred to as the non-conducting state, a high impedance is present between the two terminals. In a second programming state, further referred to as the conducting state, a low-impedance bi-directional electrical interconnection is realized between the two terminals. Many different embodiments of programmable switch 24 are known, such as: an NMOS/PMOS pass transistor pair with programmable element; an NMOS pass transistor driven by a programmable element with a high gate voltage that exceeds the signal high level by at least the threshold voltage of the transistor; anti-fuses; etc. These embodiments are known to those of ordinary skill in the art.

Figure 3A:
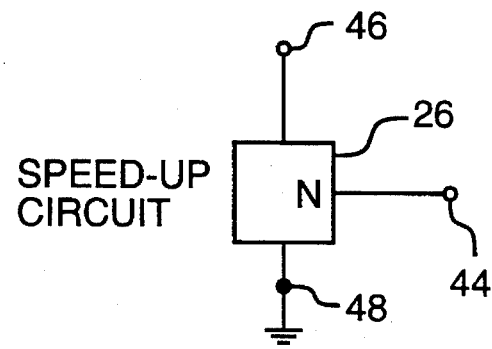
FIG. 3a shows a block diagram of the speed-up circuit of in FIG. 1.

FIG. 3a shows a block diagram of a speed-up circuit 26 according to the present invention, connected to a network node 44, a supply voltage node 46, and a ground node 48.

The operation of speed-up circuit 26 of FIG. 3a is as follows. Speed-up circuit 26 has three internal states. In a first state, called the stand-by state, speed-up circuit 26 provides a high-impedance equivalent to an open circuit at network node 44. In addition, while in the stand-by state, speed-up circuit 26 monitors the logic level on network node 44. If the logic level on network node 44 is forced, by an external circuit (not shown), from an initial high level towards a low level that is below a predetermined threshold, speed-up circuit 26 goes temporarily to a second state, called the discharge state. In the discharge state, speed-up circuit 26 provides a low-impedance connection between network 44 and the low level on ground node 48. If the logic level on network node 44 is forced, by an external circuit (not shown), from an initial low level towards a high level that is above a predetermined threshold, speed-up circuit 26 goes temporarily to a third state, called the charge state. In the charge state, speed-up circuit 26 provides a low-impedance connection between network node 44 and the high level on supply voltage node 46. Both the charge and the discharge state are also referred to as enforce states. In the enforce states, a level change on network node 44 due to an external circuit is enforced by speed-up circuit 26. The charge and the discharge states are temporary states: after having been during predetermined period of time in either the charge or the discharge state, speed-up circuit 26 goes back to the stand-by state.

Hence, in order to explain the operation, it is assumed that speed-up circuit 26 is initially in the stand-by state, where it provides a high impedance on network node 44. First, the case is considered where the level on network node 44 is a high logic level. In the stand-by state, speed-up circuit 26 monitors the logic level on network node 44. If a neighboring, connected circuit pulls network node 44 down to a level below a threshold level, speed-up circuit 26 goes to its discharge state, and network node 44 is further pulled low by speed-up circuit 26. After the predetermined period of time, speed-up circuit 26 turns back to its stand-by state, providing a high-impedance at network node 44, which by now has been charged to a low logic level. If at this point a neighboring, connected circuit pulls network node 44 up to a level above a threshold level, speed-up circuit 26 goes to its charge state, and network node 44 is further pulled high by speed-up circuit 26. After the predetermined period of time, speed-up circuit 26 turns back to its stand-by state, providing a high-impedance at network node 44, which by now has been charged to a high logic level.

Speed-up circuit 26 may be used to quickly, in a bi-directional manner, transmit data across a programmable interconnect architecture of conductive leads interconnected by passive switches. For example, now referring back to FIG. 1, programmable switches 24a through 24f, as explained earlier, may be individually programmed to be either in the conducting or the non-conducting state. Assume now that programmable switches 24a, 24f and 24d are programmed to the conducting state, while the other programmable switches 24b, 24c, and 24e are programmed to the non-conducting state. This establishes a conductive path from conductive lead 22a, through conductive leads 22b and 22f, to conductive lead 22e, in which each of programmable switches 24a, 24f and 24d can be modeled by its on-resistance, and each of conductive leads 22a, 22b, 22f, and 22e can be modeled by the lumped capacitance contribution of each conductive lead and the input/output capacitances of the circuits connected to it. Assume that initially, a high level is present on input node 30A. Then, a high level is also present at the output of buffer 28A, on conductive lead 22a. Also assume that initially, a high level is present on all conductive leads 22a through 22g, and that all speed-up circuits 26a through 26g are in the stand-by state and provide a high impedance at their network nodes N. If now a low level appears on input node 30A, a high-to-low level transition will appear at the output of buffer 28A, on conductive lead 22a. When the level on conductive lead 22a drops below a predetermined threshold, speed-up circuit 26a temporarily goes to its discharge state, where it provides a low-impedance connection between conductive lead 22a and its ground node. Meanwhile, conductive lead 22b is being discharged, through a resistive path through programmable switch 24a, and on, partly through buffer 28A, partly through network terminal N of speed-up circuit 26a. Hence, in turn, if speed-up circuit 26b detects a change below a certain threshold voltage on conductive lead 22b, it temporarily goes to its discharge state and enforces a low level at its network terminal N. Meanwhile, conductive leads 22f and 22e are being discharged in a similar way, and speed-up circuits 26f and 26e temporarily go to the discharge state in turn, and start enforcing a low level. Finally, the level on conductive lead 22e turns low. The low level on conductive lead 22e also appears at the output of buffer 32B, on output node 34B. Hence, a high-to-low transition on input node 30A quickly propagates through programmable interconnect architecture 20 and appears on output node 34B. After a predetermined period of time, each of speed-up circuits 26a, 26b, 26f and 26e turns back to the stand-by state, providing a high impedance at their network nodes N. At that point, conductive leads 22a, 22b, 22f and 22e stay at a low level, due to capacitive charge storage and due to the low level output of buffer 28A.

Complementarily, a subsequent low-to-high transition on input node 30A quickly propagates through programmable interconnect architecture 20, causing each speed-up circuit 26a, 26b, 26f and 26e in the signal propagation path to turn from its standby state to its charge state. The low-to-high transition finally appears on output node 34B.

Conversely, high-to-low and low-to-high transitions on input node 30B quickly propagate through programmable interconnect architecture 20 and appear on output node 34A. Hence, a circuit style for providing fast, bi-directional interconnections, compatible with static logic and with dynamic logic, is obtained. It can be shown that the delay through such a network is approximately a linear function of the number of switches traversed. Many variations are possible. It is not necessary to place speed-up circuits at every conductive lead. Alternatively, several speed-up circuits may be placed at different positions along a single conductive lead.

Figure 3B:
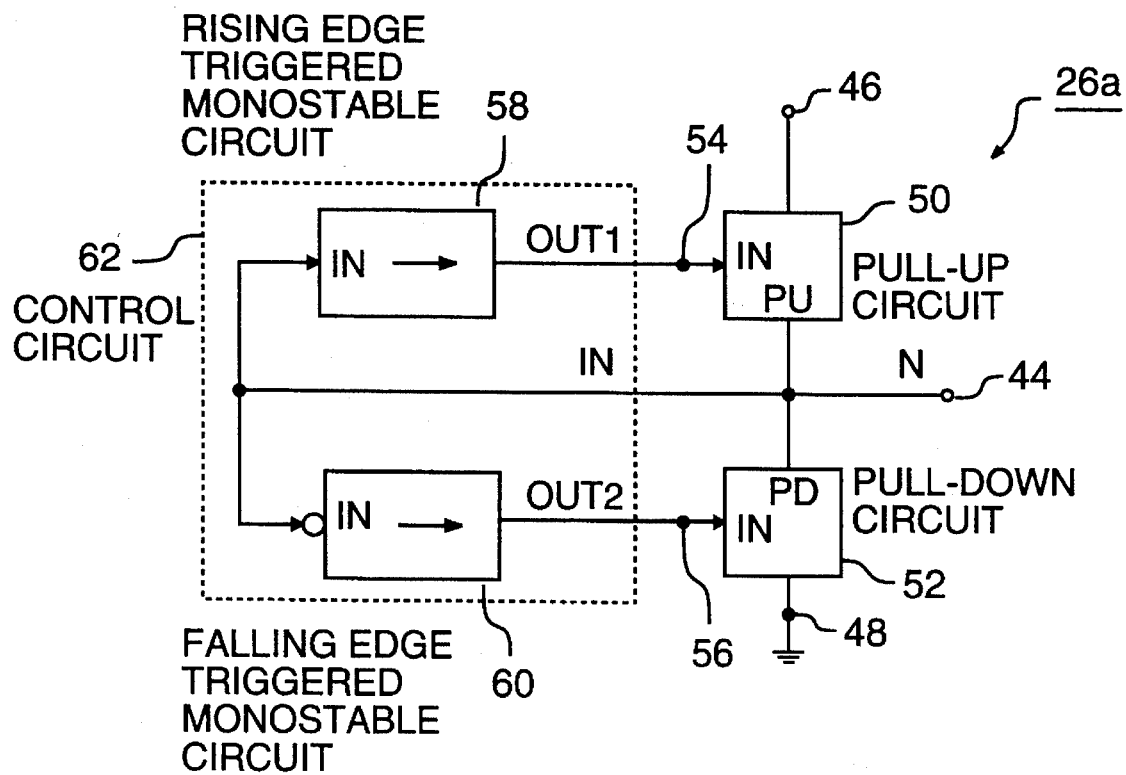
FIG. 3b shows a more detailed block diagram of an embodiment of a speed-up circuit according to the present invention.

FIG. 3b shows a more detailed block diagram of an embodiment 26a of a speed-up circuit according to the present invention. Embodiment 26a comprises network node 44, supply voltage node 46 and ground node 48. Embodiment 26a further comprises a pull-up circuit 50, a pull-down circuit 52, two intermediate nodes 54 and 56, and a control circuit 62. In embodiment 26a shown in FIG. 3b, control circuit 62 comprises a rising edge triggered monostable circuit 58 and a falling edge triggered monostable circuit 60. Pull-up circuit 50 has a connection to supply voltage node 46, has a pull-up terminal PU connected to network node 44, and has an input IN connected to intermediate node 54. Pull-down circuit 52 has a connection to ground node 48, has a pull-down terminal PD connected to network node 44, and has an input IN connected to intermediate node 56. Control circuit 62 has an input IN connected to network node 44, an output OUT1 connected to intermediate node 54, and an output OUT2 connected to intermediate node 56. In the embodiment shown in FIG. 3b, rising edge triggered monostable circuit 58 has its input connected to the input IN of control circuit 62, in turn connected to network node 44; and has its output connected to output OUT1 of control circuit 62, in turn connected to intermediate node 54. Also in the embodiment shown in FIG. 3b, falling edge triggered monostable circuit 60 has its input connected to the input IN of control circuit 62, in turn connected to network node 44; and has its output connected to output OUT2 of control circuit 62, in turn connected to intermediate node 56.

The operation of embodiment 26a shown in FIG. 3b is as follows. When a high logic level is present on input IN of pull-up circuit 50, a low-impedance interconnection is established between supply voltage node 46 and pull-up terminal PU. When a low logic level is present on input IN of pull-up circuit 50, a high impedance, equivalent to an open circuit, is established at pull-up terminal PU. Similarly, when a high logic level is present on input IN of pull-down circuit 52, a low-impedance interconnection is established between ground node 48 and pulldown terminal PD. When a low logic level is present on input IN of pull-up circuit 52, a high impedance, equivalent to an open circuit, is established at pull-down terminal PD. The operation of control circuit 62 is such that when a high-to-low transition is detected at its input IN, to a level below a predetermined threshold, a high level pulse of predetermined length appears on output OUT2. Output OUT2 is at a low level under all other conditions. When a low-to-high transition is detected at its input IN to a level above a predetermined threshold, a high level pulse of predetermined length appears on output OUT1. Output OUT1 is at a low level under all other conditions. Turning now to the embodiment of control circuit 62 shown in FIG. 3b, when a high-to-low transition appears at input IN of control circuit 62, falling edge triggered monostable circuit 60 produces a high level pulse of predetermined length at its output. The exact threshold of the input level at which a pulse is triggered depends on the actual implementation of falling edge triggered monostable circuit 60, as is known to those of ordinary skill in the art. When a low-to-high transition appears at input IN of control circuit 62, rising edge triggered monostable circuit 58 produces a high level pulse of predetermined length at its output. The exact threshold of the input level at which a pulse is triggered depends on the actual implementation of rising edge triggered monostable circuit 58. Assume that initially a high level is present at network node 44, and that both monostable circuits 58 and 60 have a low level at their output. Then, both pull-up circuit 50 and pull-down circuit 52 provide a high impedance to network node 44. The speed-up circuit is in its stand-by state, with network node 44 at a high level. Assume now that due to an external circuit, connected to network node 44, not shown in FIG. 3b, the level on network node 44 is forced lower. At a certain point, the level is forced below the threshold of falling edge triggered monostable circuit 60, which now generates a high level pulse of predetermined length onto intermediate node 56. This high level pulse causes pull-down circuit 52 to temporarily provide a low-impedance interconnection between network node 44 and ground node 48. The speed-up circuit is in the discharge state, and it enforces the high-to-low level change on network node 44 that was initiated by an external circuit. When the output of falling edge triggered monostable circuit 60 turns back to the low level, both pull-up circuit 50 and pull-down circuit 52 again provide a high-impedance on network node 44. The speed-up circuit is back in the stand-by state, but now with a low level on network node 44. As long as an external circuit is pulling down network node 44, the level on network node 44 stays low. If no external circuit is influencing network node 44, the level on network node 44 stays low due to capacitive charge storage. Assume now that network node 44 is pulled up by an external circuit to a level above the threshold of rising edge monostable circuit 58. Rising edge monostable circuit 58 produces a high level pulse of predetermined length onto intermediate node 54. This pulse causes pull-up circuit 50 to temporarily provide a low-impedance interconnection between network node 44 and supply voltage node 46. The speed-up circuit is in the charge state, and it enforces the low-to-high level change on network node 44 that was initiated by an external circuit. When the output of rising edge triggered monostable circuit 58 turns back to the low level, both pull-up circuit 50 and pull-down circuit 52 again provide a high-impedance on network node 44. The speed-up circuit is back in the stand-by state, with a high level on network node 44.

Figures 3C, 3D:
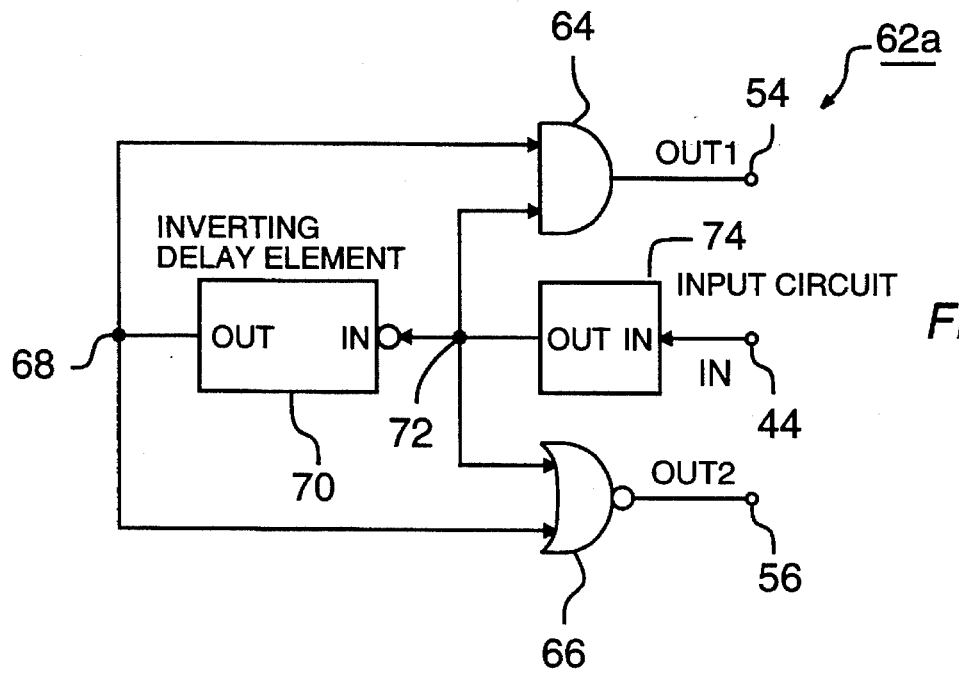
FIG. 3c shows the schematic of an embodiment of the control circuitry in FIG. 3b.
FIG. 3d shows the node potentials versus time for the nodes of the embodiment of FIG. 3c.

FIG. 3c shows an alternative embodiment of control circuit 62 of FIG. 3b, labeled as 62a. Control circuit 62a of FIG. 3c comprises connections to intermediate nodes 54 and 56, and to network node 44. Control circuit 62a further comprises an input circuit 74, an intermediate node 72, an inverting delay circuit 70, an intermediate node 68, a logic AND gate 64, and a logic NOR gate 66. Input circuit 74 has its input connected to network node 44, and has its output connected to intermediate node 72. Inverting delay circuit 70 has its input connected to intermediate node 72, and has its output connected to intermediate node 68. Logic NAND gate 64 has its output connected to intermediate node 54, has a first input connected to intermediate node 68, and has a second input connected to intermediate node 72. Logic NOR gate 66 has its output connected to intermediate node 56, has a first input connected to intermediate node 68, and has a second input connected to intermediate node 72.

Input circuit 74 is a non-inverting circuit. It may be chosen to be a buffer; a Schmitt-trigger, with the rising edge threshold voltage either higher or lower than the falling edge threshold voltage; or simply a direct connection.

While network node 44 is at a constant high level, input circuit 74 reproduces that high level at its output, on intermediate node 72. Since the high level is constant, the output of inverting delay circuit 70 is at a constant low level, on intermediate node 68. Hence, one input to logic AND gate 64 is high, and the other input is low, causing the output of logic AND gate 64 to be low, on output OUT1 of control circuit 62a, and on intermediate node 54. Also, one input to logic NOR gate 66 is high, and the other input is low, causing the output of logic NOR gate 66 to be low.

When a high-to-low transition occurs on network node 44, non-inverting input circuit 74 in turn causes a high-to-low transition to occur on intermediate node 72. The exact waveform of the high-to-low transition on intermediate node 72 depends on the type of input circuit that was employed, but that is not essential to the operation of control circuit 62a. Inverting delay circuit 70 produces a low-to-high transition on intermediate node 68. This low-to-high transition is delayed by a predetermined delay. The actual delay depends on the design of inverting delay circuit 70. Such an inverting delay circuit may be implemented using an odd number of inverters; or using inverters with deteriorated driver transistors for extra delay; or using inverters that drive a capacitive node through a resistor; etc., as is well known to those of ordinary skill in the art. Hence, after a high-to-low transition on network node 44, for a period of time that approximately equals the delay imposed by inverting delay circuit 70, both intermediate nodes 72 and 68 are at a low level: intermediate node 72 is at a low level because the high-to-low transition has already occurred; intermediate node 68 is at a high level because the low-to-high transition has not yet occurred. During that time, both inputs to logic NOR gate 66 are low, and hence a high level appears at its output, on output OUT2 of control circuit 62a, and on intermediate node 56. The two inputs to logic AND gate 64, meanwhile, are low, causing a low level on intermediate node 54.

While network node 44 is at a constant low level, input circuit 74 reproduces that low level at its output, on intermediate node 72. Since the low level is constant, the output of inverting delay circuit 70 is at a constant high level, on intermediate node 68. Hence, one input to logic AND gate 64 is high, and the other input is low, causing the output of logic AND gate 64 to be low, on output OUT1 of control circuit 62a, and on intermediate node 54. Also, one input to logic NOR gate 66 is high, and the other input is low, causing the output of logic NOR gate 66 to be low.

When a low-to-high transition occurs on network node 44, non-inverting input circuit 74 in turn causes a low-to-high transition to occur on intermediate node 72. Inverting delay circuit 70 produces a high-to-low transition on intermediate node 68. Hence, after a low-to-high transition on network node 44, for a period of time that approximately equals the delay imposed by inverting delay circuit 70, both intermediate nodes 72 and 68 are at a high level: intermediate node 72 is at a high level because the low-to-high transition has already occurred; intermediate node 68 is at a high level because the high-to-low transition has not yet occurred. During that time, both inputs to logic NOR gate 66 are high, and hence a low level appears at its output, on output OUT2 of control circuit 62a, and on intermediate node 56. The two inputs to logic AND gate 64, meanwhile, are high also, causing a high level to appear at its output, on output OUT1 of control circuit 62a, and on intermediate node 54.

In order to further clarify the previous explanation, refer to FIG. 3d, which shows a table of waveforms at various nodes of the embodiment of the control circuit of FIG. 3c. The first column of the table contains the labels of nodes of FIG. 3c. The same reference labels have been used in FIGS. 3d and 3c. The second column of the table in FIG. 3d contains the waveforms at the various nodes for a low-to-high transition at the input IN of the control circuit. The third column of the table in FIG. 3d contains the waveforms at the various nodes for a high-to-low transition at the input IN of the control circuit.

Figure 4:
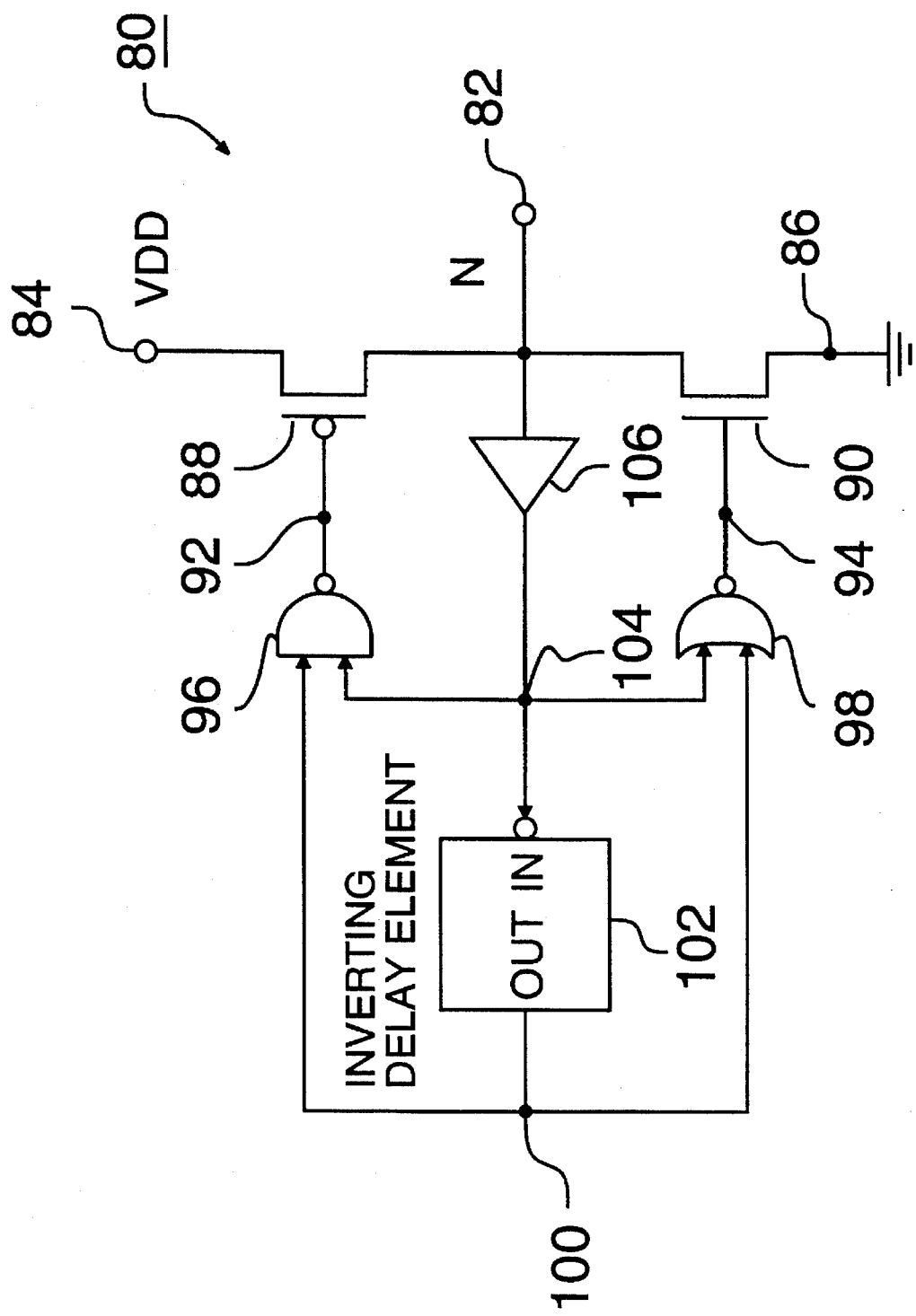
FIG. 4 shows the schematic of an embodiment of a speed-up circuit according to the present invention.

FIG. 4 shows the schematic of an embodiment 80 of a speed-up circuit according to the present invention. Embodiment 80 comprises a supply voltage node 84, a ground node 86, and a network node 82. Embodiment 80 further comprises four intermediate nodes 92, 94, 100, and 104, a buffer 106, an inverting delay circuit 102, an intermediate node 100, a logic NAND gate 96, a logic NOR gate 98, a PMOS transistor 88, and an NMOS transistor 90. Buffer 106 has its input connected to network node 82, and has its output connected to intermediate node 104. Inverting delay circuit 102 has its input connected to intermediate node 104, and has its output connected to intermediate node 100. Logic NAND gate 96 has its output connected to intermediate node 92, has its first input connected to intermediate node 100, and has its second input connected to intermediate node 104. Logic NOR gate 98 has its output connected to intermediate node 94, has its first input connected to intermediate node 100, and has its second input connected to intermediate node 104. PMOS transistor 88 has its gate connected to intermediate node 92, has its first current electrode connected to supply voltage node 84, and has its second current electrode connected to network node 82. NMOS transistor 90 has its gate connected to intermediate node 94, has its first current electrode connected to ground node 86, and has its second current electrode connected to network node 82.

While network node 82 is at a constant high level, buffer 106 reproduces that high level at its output, on intermediate node 104. Since the high level is constant, the output of inverting delay circuit 102 is at a constant low level, on intermediate node 100. Hence, one input to logic NAND gate 96 is high, and the other input is low, causing the output of logic NAND gate 96, on intermediate node 92, to be high. Also, one input to logic NOR gate 98 is high, and the other input is low, causing the output of logic NOR gate 98, on intermediate node 94, to be low. Both PMOS transistor 88 and NMOS transistor 90 are OFF. The speed-up circuit is in the stand-by state, with a high level on network node 82.

When a high-to-low transition occurs on network node 82, buffer 106 in turn causes a high-to-low transition to occur on intermediate node 104. Inverting delay circuit 102 produces a low-to-high transition on intermediate node 100. This low-to-high transition is delayed by a predetermined delay. Hence, after a high-to-low transition on network node 82, for a period of time that approximately equals the delay imposed by inverting delay circuit 102, both intermediate nodes 104 and 100 are at a low level: intermediate node 100 is at a low level because the high-to-low transition has already occurred; intermediate node 104 is at a low level because the low-to-high transition has not yet occurred. During that time, both inputs to logic NOR gate 98 are low, and hence its output, on intermediate node 94, is high. The two inputs to logic NAND gate 96, meanwhile, are low, causing a high level on intermediate node 92. NMOS transistor 90 is ON, pulling down network node 82, while PMOS transistor 88 is OFF. The speed-up circuit is temporarily in the discharge state.

While network node 82 is at a constant low level, buffer 106 reproduces that low level at its output, on intermediate node 104. Since the low level is constant, the output of inverting delay circuit 102 is at a constant high level, on intermediate node 100. Hence, one input to logic NAND gate 96 is high, and the other input is low, causing the output of logic NAND gate 96, on intermediate node 92, to be high. Also, one input to logic NOR gate 98 is high, and the other input is low, causing the output of logic NOR gate 98 to be low. Both PMOS transistor 88 and NMOS transistor 90 are OFF. The speed-up circuit is in the stand-by state, with a low level on network node 82.

When a low-to-high transition occurs on network node 82, buffer 106 in turn causes a low-to-high transition to occur on intermediate node 104. Inverting delay circuit 102 produces a high-to-low transition on intermediate node 100. Hence, after a low-to-high transition on network node 82, for a period of time that approximately equals the delay imposed by inverting delay circuit 102, both intermediate nodes 104 and 100 are at a high level: intermediate node 104 is at a high level because the low-to-high transition has already occurred; intermediate node 100 is at a high level because the high-to-low transition has not yet occurred. During that time, both inputs to logic NOR gate 98 are high, and hence a low level appears at its output, on intermediate node 94. The two inputs to logic NAND gate 96, meanwhile, are high also, causing a low level to appear at its output, on intermediate node 92. PMOS transistor 88 is ON, pulling up network node 82, while NMOS transistor 90 is OFF. The speed-up circuit is temporarily in the charge state.

In embodiment 80 of FIG. 4, buffer 106 may be replaced by a direct connection. In that case, the threshold level on network node 82 at which the speedup circuit goes to the charge state is determined by the equivalent trip point of logic NAND gate 96 when one of its inputs is high, while the threshold level on network node 82 at which the speed-up circuit goes to the discharge state is determined by the equivalent trip point of logic NOR gate 98 when one of its inputs is low.

Figure 5:
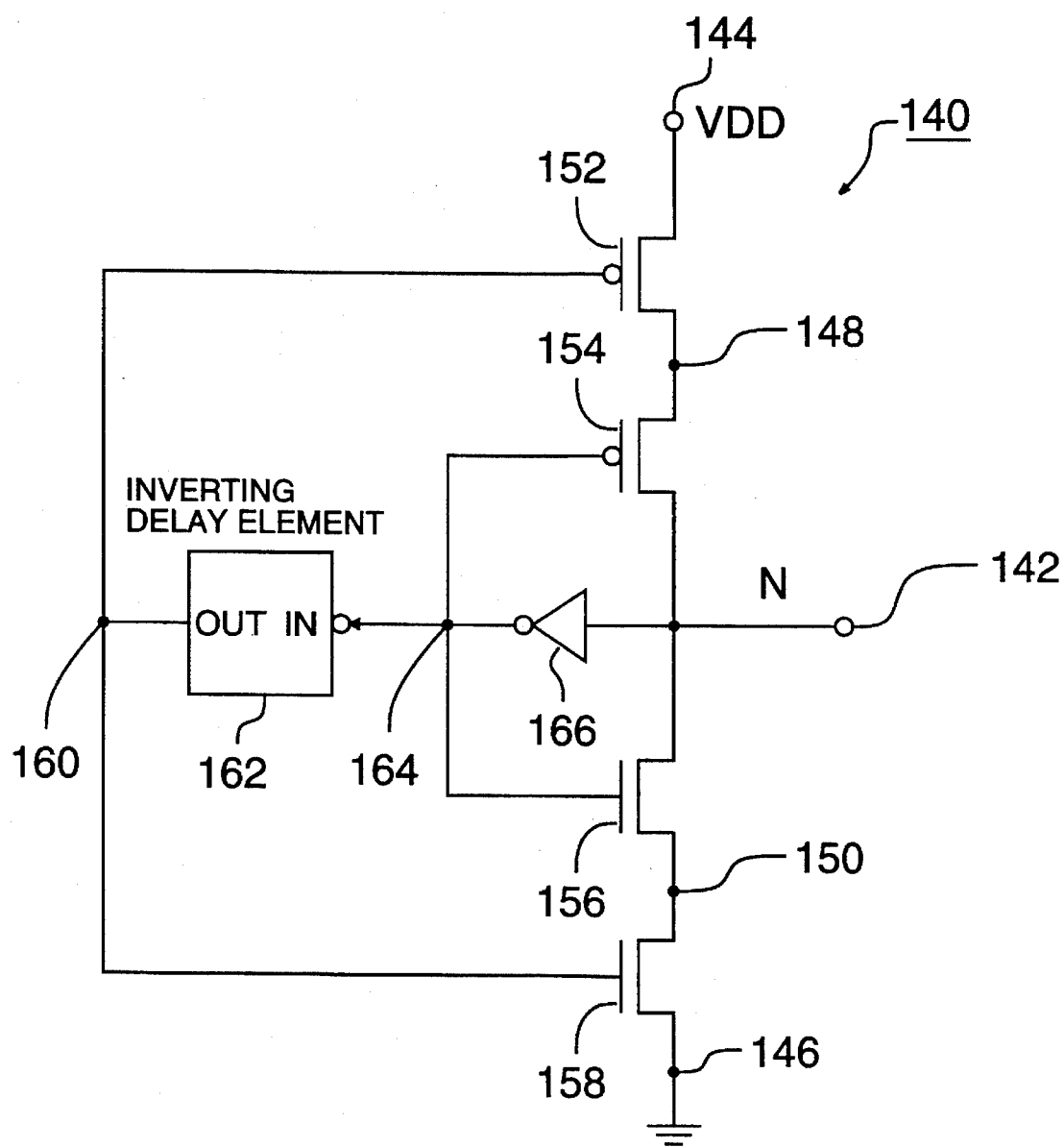
FIG. 5 shows the schematic of an embodiment of a speed-up circuit according to the present invention.

FIG. 5 shows the schematic of an embodiment 140 of a speed-up circuit according to the present invention. Embodiment 140 comprises a supply voltage node 144, a ground node 146, and a network node 142. Embodiment 140 further comprises four intermediate nodes 148, 150, 160 and 164, an inverter 166, an inverting delay circuit 162, two PMOS transistors 152 and 154, and two NMOS transistors 156 and 158. Inverter 166 has its input connected to network node 142, and has its output connected to intermediate node 164. Inverting delay circuit 162 has its input connected to intermediate node 164, and has its output connected to intermediate node 160. PMOS transistor 152 has its gate connected to intermediate node 160, has its first current electrode connected to supply voltage node 144, and has its second current electrode connected to intermediate node 148. PMOS transistor 154 has its gate connected to intermediate node 164, has its first current electrode connected to intermediate node 148, and has its second current electrode connected to network node 142. NMOS transistor 158 has its gate connected to intermediate node 150, has its first current electrode connected to ground node 146, and has its second current electrode connected to intermediate node 150. NMOS transistor 156 has its gate connected to intermediate node 164, has its first current electrode connected to intermediate node 150, and has its second current electrode connected to network node 142.

While network node 142 is at a constant high level, inverter 166 has a low level at its output, on intermediate node 164. Since the levels are constant, the output of inverting delay circuit 162 is at a constant high level, on intermediate node 160. PMOS transistor 154 is ON and PMOS transistor 152 is OFF, and there is no active pull-up of network node 142 by the speed-up circuit. NMOS transistor 158 is ON and NMOS transistor 156 is OFF, and there is no active pull-down of network node 142 by the speed-up circuit. The speed-up circuit is in the stand-by state and network node 142 is at a high level.

When a high-to-low transition occurs on network node 142, and the level reaches the trip point of inverter 166, inverter 166 causes a low-to-high transition on intermediate node 164. Inverting delay circuit 162 produces a high-to-low transition on intermediate node 160. This high-to-low transition is delayed by a predetermined delay. Hence, after a high-to-low transition on network node 142, for a period of time that approximately equals the delay imposed by inverting delay circuit 162, intermediate node 164 is at a high level, while intermediate node 160 is at a high level: intermediate node 164 is at a high level because the lowto-high transition has already occurred; intermediate node 160 is at a high level because the high-to-low transition has not yet occurred. During that time, both NMOS transistors 158 and 156 are ON, causing an active pull-down of network node 142. Meanwhile, both PMOS transistors 152 and 154 are OFF. The speed-up circuit is temporarily in the discharge state.

While network node 142 is at a constant low level, inverter 166 has a high level at its output, on intermediate node 164. Since the levels are constant, the output of inverting delay circuit 162 is at a constant low level, on intermediate node 160. PMOS transistor 154 is OFF and PMOS transistor 152 is ON, and there is no active pull-up of network node 142 by the speed-up circuit. NMOS transistor 158 is OFF and NMOS transistor 156 is ON, and there is no active pull-down of network node 142 by the speed-up circuit. The speed-up circuit is in the stand-by state and network node 142 is at a low level.

When a low-to-high transition occurs on network node 142, and the level reaches the trip point of inverter 166, inverter 166 causes a high-to-low transition on intermediate node 164. Inverting delay circuit 162 produces a low-to-high transition on intermediate node 160. This low-to-high transition is delayed by a predetermined delay. Hence, after a low-to-high transition on network node 142, for a period of time that approximately equals the delay imposed by inverting delay circuit 162, intermediate node 164 is at a low level, while intermediate node 160 is at a low level: intermediate node 164 is at a low level because the high-to-low transition has already occurred; intermediate node 160 is at a low level because the low-to-high transition has not yet occurred. During that time, both PMOS transistors 152 and 154 are ON causing an active pull-up of network node 142. Meanwhile, both NMOS transistors 156 and 158 are OFF. The speed-up circuit is temporarily in the charge state.

Figure 6:
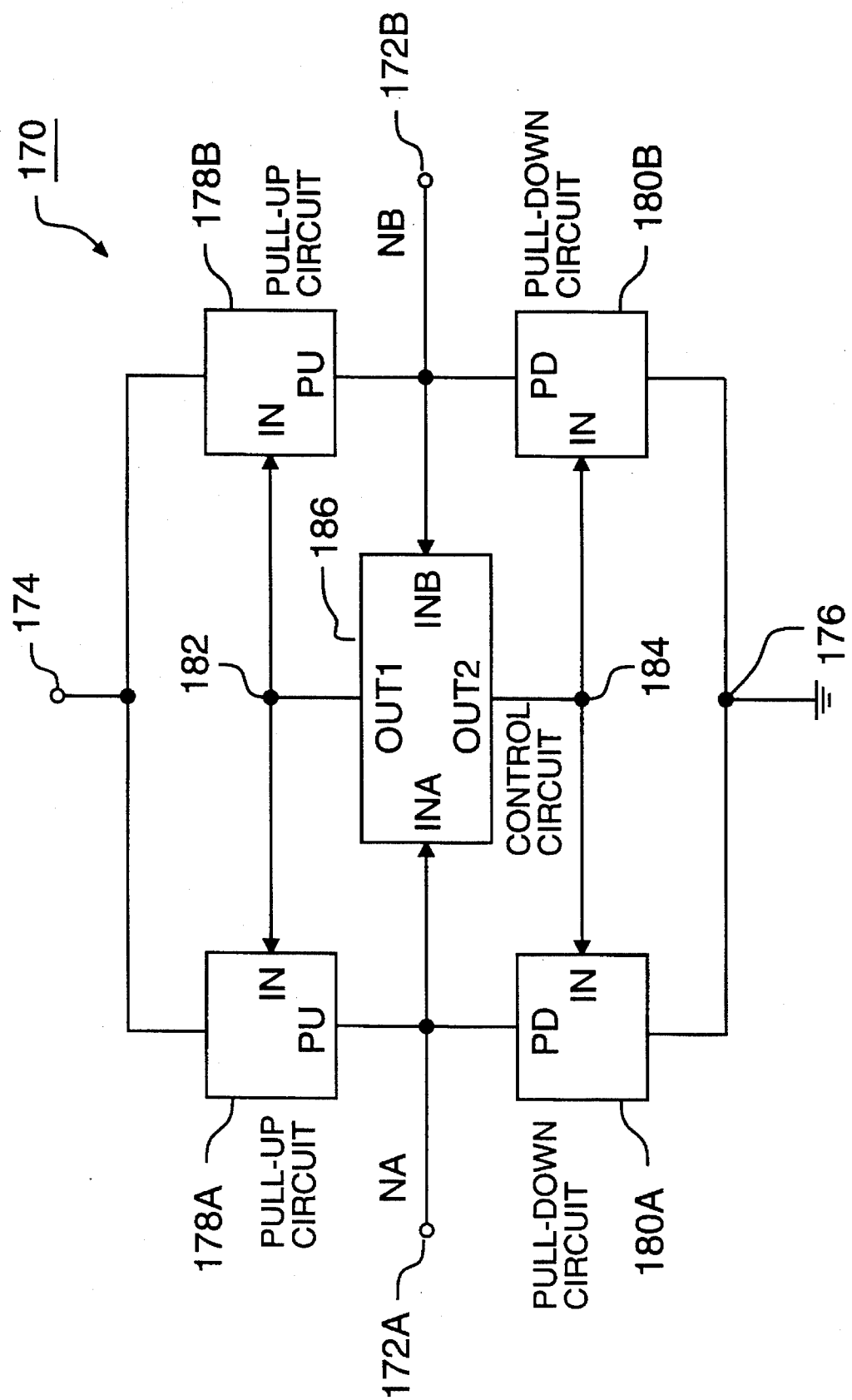
FIG. 6 shows a block diagram of a bi-directional two-terminal bus repeater according to the present invention.

FIG. 6 shows a block diagram of an embodiment 170 of a bi-directional two-terminal bus repeater according to the present invention. Embodiment 170 comprises a supply voltage node 174, a ground node 176, and two network nodes 172A and 172B. Embodiment 170 further comprises two intermediate nodes 182 and 184, two pull-up circuits 178A and 178B, two pull-down circuits 180A and 180B, and a control circuit 186. Pull-up circuit 178A has a connection to supply voltage node 174, has an input IN connected to intermediate node 182, and has a pull-up terminal PU connected to network node 172A. Pull-up circuit 178B has a connection to supply voltage node 174, has an input IN connected to intermediate node 182, and has a pull-up terminal PU connected to network node 172B. Pull-down circuit 180A has a connection to ground node 176, has an input IN connected to intermediate node 184, and has a pull-down terminal PD connected to network node 172A. Pull-down circuit 180B has a connection to ground node 176, has an input IN connected to intermediate node 184, and has a pull-down terminal PD connected to network node 172B. Control circuit 186 has an input INA connected to network node 172A, an input INB connected to network node 172B, an output OUT1 connected to intermediate node 182, and an output OUT2 connected to intermediate node 184.

The operation of embodiment 170 shown in FIG. 6 is as follows. When a high logic level is present on intermediate node 182, pull-up circuit 178A establishes a low-impedance interconnection between supply voltage node 174 and network node 172A, and pull-up circuit 178B establishes a low-impedance interconnection between supply voltage node 174 and network node 172B. When a low logic level is present on intermediate node 182, pull-up circuit 178A provides a high impedance at its pull-up terminal PU, and pull-up circuit 178B provides a high impedance at its pull-up terminal PU. Similarly, when a high logic level is present on intermediate node 184, pull-down circuit 180A establishes a low-impedance interconnection between ground node 176 and network node 172A, and pull-down circuit 180B establishes a low-impedance interconnection between ground node 176 and network node 172B. When a low logic level is present on intermediate node 164, pull-down circuit 180A establishes a high impedance at its pull-down terminal PD, and pull-down circuit 180B establishes a high impedance at its pull-down terminal PD.

Control circuit 186 is designed such that when a constant high level is present on both network nodes 172A and 172B, both its outputs OUT1 and OUT2 connected to intermediate nodes 182 and 184, are low. Therefore, pull-up circuits 178A and 178B as well as pull-down circuits 180A and 180B are providing a high impedance to network nodes 172A and 172B. Embodiment 170 is in the stand-by state, having a high level on both network nodes 172A and 172B.

When a high-to-low transition is detected at either of network nodes 172A or 172B, control circuit 186 temporarily produces a high level on its output OUT2 connected to intermediate node 184, while its output OUT1 on intermediate node 182 stays low. Pull-up circuits 178A and 178B are providing a high impedance to network nodes 172A and 172B, while pull-down circuits 180A and 180B temporary pull down both network nodes 172A and 172B. Embodiment 170 is temporarily in the discharge state.

When a constant low level is present on both network nodes 172A and 172B, control circuit 186 produces a low level on both of its outputs OUT1 and OUT2, connected to intermediate nodes 182 and 184. Therefore, pull-up circuits 178A and 178B as well as pull-down circuits 180A and 180B are providing a high impedance to network nodes 172A and 172B. Embodiment 170 is in the stand-by state, having a low level on both network nodes 172A and 172B.

When a low-to-high transition is detected at either of network nodes 172A or 172B, control circuit 166 temporarily produces a high level on its output OUT1 connected to intermediate node 162, while its output OUT2 on intermediate node 184 stays low. Pull-down circuits 180A and 180B are providing a high impedance to network nodes 172A and 172B, while pull-up circuits 178A and 178B temporarily pull up both network nodes 172A and 172B. Embodiment 170 is temporarily in the charge state.

Figure 7A:
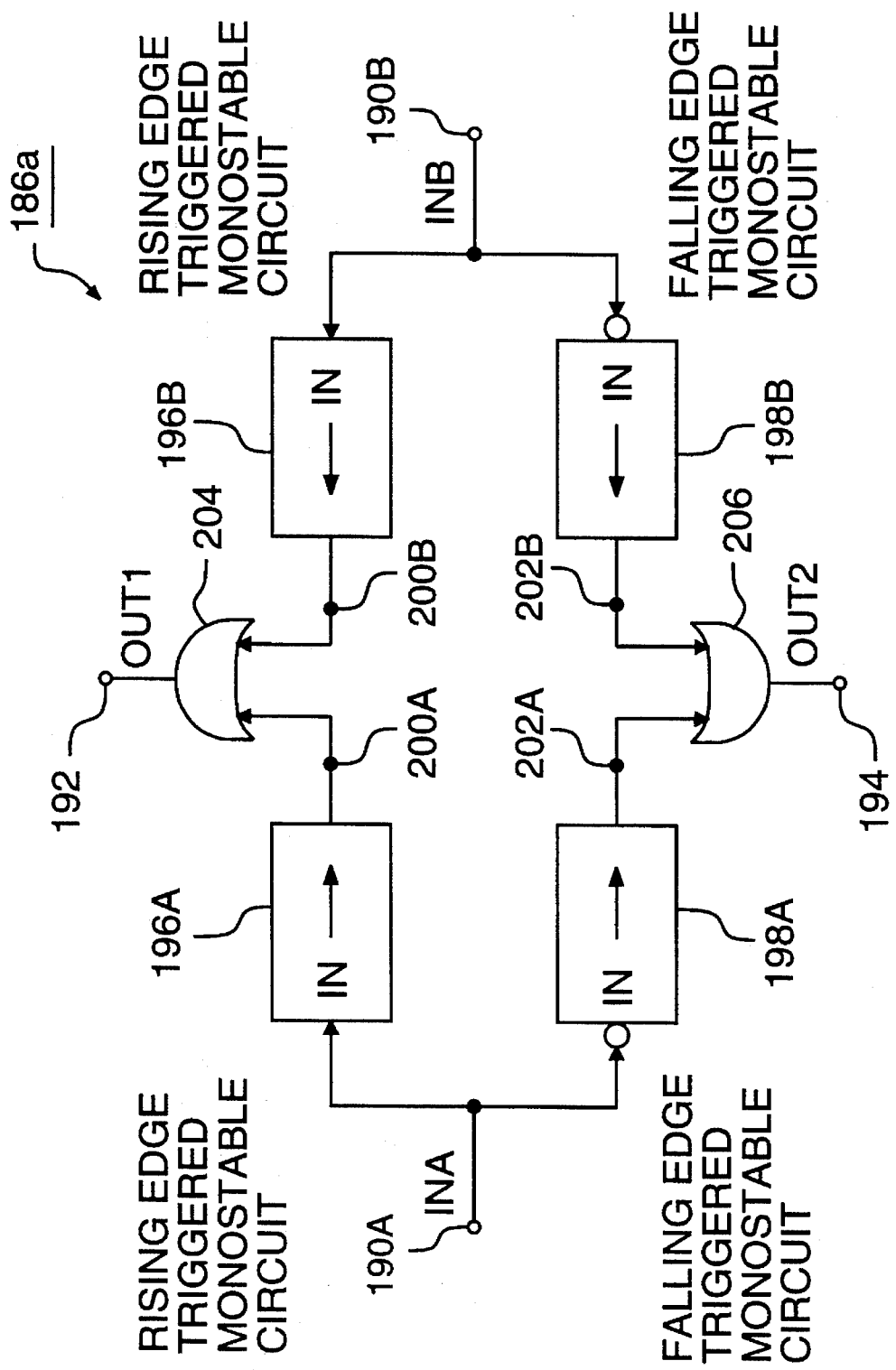
FIGS. 7a and 7b show the schematics of embodiments of the control circuitry in FIG. 6.

FIG. 7a shows an embodiment of control circuit 186 of FIG. 6, here referred to by label 186a. Control circuit 186a comprises two input nodes 190A and 190B, and two output nodes 192 and 194. Control circuit 186a further comprises four intermediate nodes 200A, 200B, 202A, and 202B, two rising edge triggered monostable circuits 196A and 196B, two falling edge triggered monostable circuits 198A and 198B, and two logic OR gates 204 and 206. Rising edge triggered monostable circuit 196A has its input connected to input node 190A, and has its output connected to intermediate node 200A. Rising edge triggered monostable circuit 196B has its input connected to input node 190B, and has its output connected to intermediate node 200B. Falling edge triggered monostable circuit 198A has its input connected to input node 190A, and has its output connected to intermediate node 202A. Falling edge triggered monostable circuit 198B has its input connected to input node 190B, and has its output connected to intermediate node 202B. Logic OR gate 204 has its output connected to output node 192, has its first input connected to intermediate node 200A, and has its second input connected to intermediate node 200B. Logic OR gate 206 has its output connected to output node 194, has its first input connected to intermediate node 202A, and has its second input connected to intermediate node 202B.

The operation of control circuit 186a of FIG. 7a is as follows. When a constant high level is present on both input nodes 190A and 190B, rising edge triggered monostable circuits 196A and 196B, as well as falling edge triggered monostable circuits 198A and 198B, produce a constant low level at their outputs, on intermediate nodes 200A, 200B, 202A and 202B, respectively. Hence, at the outputs of logic OR gate 204, on output node 192, and at the output of logic OR gate 206, on output node 194, a low level is present.

A high-to-low transition at network node 190A causes falling edge triggered monostable circuit 198A to temporarily produce a high level pulse on intermediate node 202A, which propagates through logic OR gate 206 to appear on output node 194. The other monostable circuits 198B, 196A and 196B still produce a low level at their respective outputs. Hence, a low level is maintained at the output of logic OR gate 204, on output node 192, because both of its inputs are low. Similarly, a high-to-low transition at network node 190B causes a high level pulse on output node 194 while a low level is maintained on output node 192.

When a constant low level is present on both input nodes 190A and 190B, rising edge triggered monostable circuits 196A and 196B, as well as falling edge triggered monostable circuits 198A and 198B, produce a constant low level at their outputs, on intermediate nodes 200A, 200B, 202A and 202B, respectively. Hence, at the outputs of OR gate 204, on output node 192, and at the output of OR gate 206, on output node 194, a low level is present.

A low-to-high transition at network node 190A causes rising edge triggered monostable circuit 196A to temporarily produce a high level pulse on intermediate node 200A, which propagates through logic OR gate 204 to appear on output node 192. The other monostable circuits 196B, 198A and 198B still produce a low level at their respective outputs. Hence, a low level is maintained at the output of logic OR gate 206, on output node 194, because both of its inputs are low. Similarly, a low-to-high transition at network node 190B causes a high level pulse on output node 192 while a low level is maintained on output node 194.

Figure 7B:
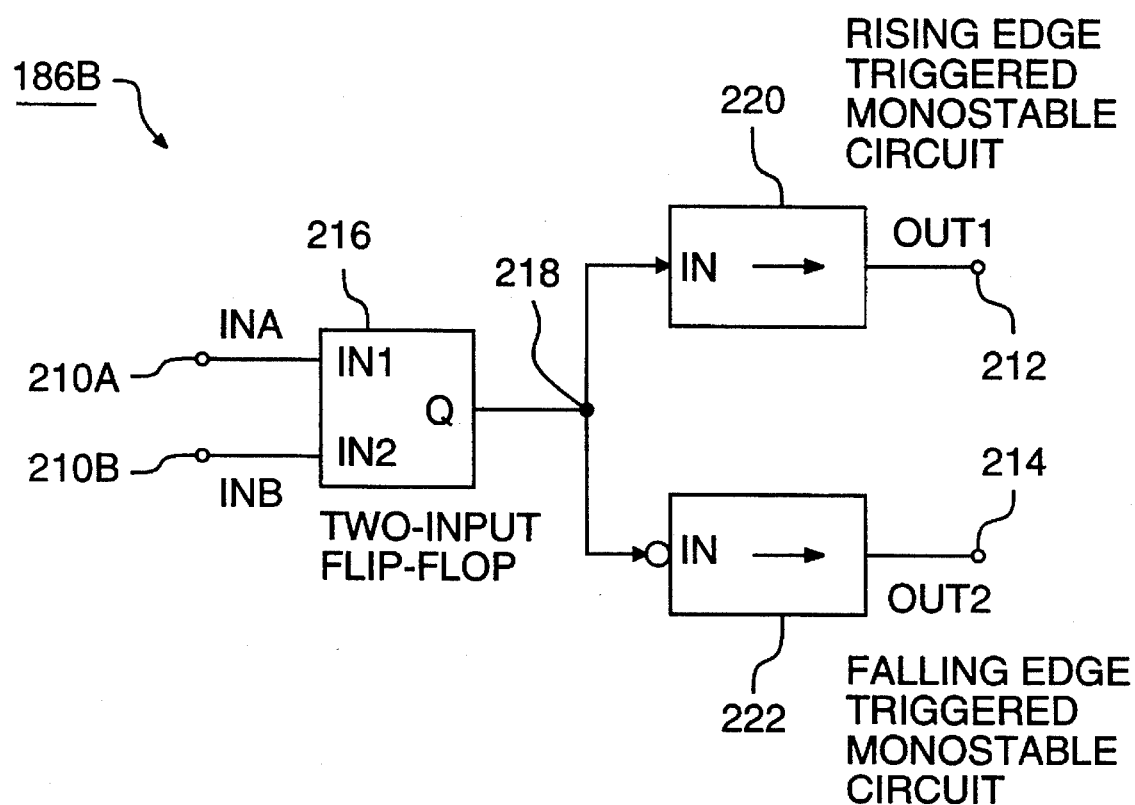

FIG. 7b shows an embodiment of control circuit 186 of FIG. 6, here referred to by label 186b. Control circuit 186b comprises two input nodes 210A and 210B, and two output nodes 212 and 214. Control circuit 186b further comprises an intermediate node 218, a two-input flip-flop 216, a rising edge triggered monostable circuit 220, and a falling edge triggered monostable circuit 222. Two-input flip-flop 216 has a first input IN1 connected to input node 210A, has a second input IN2 connected to input node 210B, and has its output Q connected to intermediate node 218. Rising edge triggered monostable circuit 220 has its input connected to intermediate node 218 and has its output connected to output node 212. Falling edge triggered monostable circuit 222 has its input connected to intermediate node 218 and has its output connected to output node 214.

The operation of control circuit 186b is as follows. Two-input flip-flop 216 is designed such that, when the output Q is at a low level, and either of its inputs IN1 or IN2 makes a low-to-high transition, while the other input remains low, the output Q goes to a high level. When the output a is at a high level, and either of its inputs IN1 or IN2 makes a high-to-low transition, while the other input remains high, the output Q goes to a low level. Else, the output Q stays retains its level.

When both input nodes 210A and 210B are at a constant high level, the output Q of two-input flip-flop 216, on intermediate node 218, stays at a constant high level. The outputs of both rising edge triggered monostable circuit 220, on output node 212, and of falling edge triggered monostable circuit 222, on output node 214, stay at a low level.

When a high-to-low transition appears on either of input nodes 210A or 210B, while the other input node remains at a high level, the output of two-input flip-flop 216, on intermediate node 218, makes a high-to-low transition. This high-to-low transition on intermediate node 218 causes falling edge triggered monostable circuit 222 to produce a high level pulse on output node 214, while rising edge triggered monostable circuit 220 maintains a low level on output node 212.

When both input nodes 210A and 210B are at a constant low level, the output Q of two-input flip-flop 216, on intermediate node 218, stays at a constant low level. The outputs of both rising edge triggered monostable circuit 220, on output node 212, and of falling edge triggered monostable circuit 222, on output node 214, stay at a low level.

When a low-to-high transition appears on either of input nodes 210A or 210B, while the other input node remains at a low level, the output of two-input flip-flop 216, on intermediate node 218, makes a low-to-high transition. This low-to-high transition on intermediate node 218 causes rising edge triggered monostable circuit 220 to produce a high level pulse on output node 212, while falling edge triggered monostable circuit 222 maintains a low level on output node 214.

Figure 8:
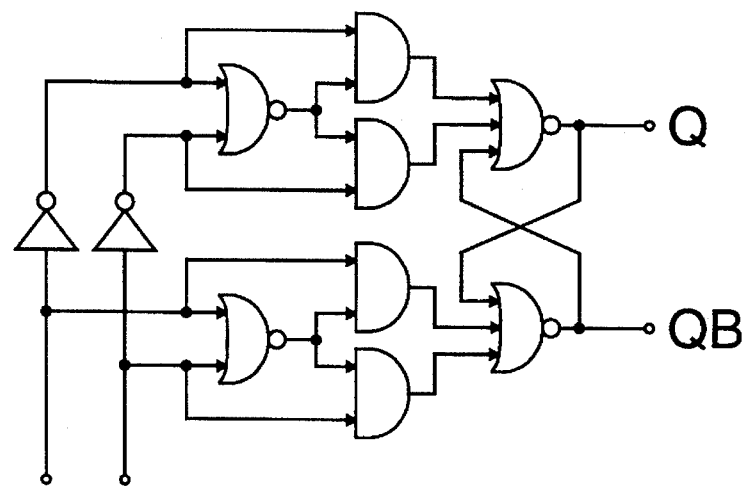
FIG. 8 shows the schematic of an embodiment of the flip-flop in FIG. 7b, as known in the art.

FIG. 8 shows an implementation of the flip-flop used in FIG. 7b. This implementation is derived from an edge-triggered set/reset flip-flop.

This detailed description of this invention is meant to be illustrative only and not limiting. Other embodiments of this invention will be obvious to those skilled in the art in view of this disclosure. More in particular, based on the embodiments shown in this application, embodiments may be derived that employ NMOS transistors, PMOS transistors, bipolar transistors, heterojunction bipolar transistors, MESFETS, and any other types of electrical or electro-optical switching devices, or combinations thereof.

The embodiment of the speed-up circuit of FIG. 3a may be used on intermediate nodes of any logic circuit, for speed-up, in a unidirectional or bi-directional manner. For example, it may be used on intermediate nodes of a static logic carry chain, on nodes in a memory circuit, on nodes in a multiplexer circuit, etc.

What is claimed is:

1. In an integrated circuit, a bi-directional bus repeater, having a supply node, a ground node, first and second network nodes, and circuitry, said circuitry providing means to detect a first rising change exceeding a predetermined threshold from a low logic level towards a high logic level on said first network node, providing means to temporarily provide a low-impedance connection between said first network node and said supply node, as well as between said second network node and said supply node, when said first rising change occurs while a low logic level is present on said second network node, said circuitry providing means to detect a second rising change exceeding a predetermined threshold from a low logic level towards a high logic level on said second network node, providing means to temporarily provide a low-impedance connection between said first network node and said supply node, as well as between said second network node and said supply node, when said second rising change occurs while a low logic level is present on said first network node, said circuitry providing means to detect a first falling change exceeding a predetermined threshold from a high logic level towards a low logic level on said first network node, providing means to temporarily provide a low-impedance connection between said first network node and said ground node, as well as between said second network node and said ground node, when said first falling change occurs while a high logic level is present on said second network node, said circuitry providing means to detect a second falling change exceeding a predetermined threshold from a high logic level towards a low logic level on said second network node, providing means to temporarily provide a low-impedance connection between said first network node and said ground node, as well as between said second network node and said ground node, when said second falling change occurs while a high logic level is present on said first network node.

2. The bi-directional bus repeater according to claim 1, wherein said circuitry comprises:

a first pull-up circuit having a supply terminal connected to said supply node, having an input terminal connected to a first control node, and having a pull-up terminal connected to said first network node, said first pull-up circuit providing means for charging said first network node to the potential of said supply node if a first predetermined logic level is asserted on said first control node, a second pull-up circuit having a supply terminal connected to said supply node, having an input terminal connected to said first control node, and having a pull-up terminal connected to said second network node, said second pull-up circuit providing means for charging said second network node to the potential of said supply node if a first predetermined logic level is asserted on said first control node, a first pull-down circuit having a ground terminal connected to said ground node, having an input terminal connected to a second control node, and having a pull-down terminal connected to said first network node, said first pull-down circuit providing means for charging said first network node to the potential of said ground node if a second predetermined logic level is asserted on said second control node, a second pull-down circuit having a ground terminal connected to said ground node, having an input terminal connected to said second control node, and having a pull-down terminal connected to said second network node, said second pull-down circuit providing means for charging said second network node to the potential of said ground node if a second predetermined logic level is asserted on said second control node, a control circuit, having a first input terminal connected to said first network node, having a second input terminal connected to said second network node, having a first output terminal connected to said first control node, having a second output terminal connected to said second control node, said control circuit providing means to detect a first rising change exceeding a predetermined threshold from a low logic level towards a high logic level on said first network node, and providing means to temporarily assert said first predetermined logic level on said first control node when said first rising change occurs while a low logic level is present on said second network node, said control circuit providing means to detect a second rising change exceeding a predetermined threshold from a low logic level towards a high logic level on said second network node, and providing means to temporarily assert said first predetermined logic level on said first control node when said second rising change occurs while a low logic level is present on said first network node, said control circuit providing means to detect a first falling change exceeding a predetermined threshold from a high logic level towards a low logic level on said first network node, and providing means to temporarily assert said second predetermined logic level on said second control node when said first falling change occurs while a high logic level is present on said second network node, and said control circuit providing means to detect a second falling change exceeding a predetermined threshold from a high logic level towards a low logic level on said second network node, and providing means to temporarily assert said second predetermined logic level on said second control node when said second falling change occurs while a high logic level is present on said first network node.

3. In an integrated circuit, a programmable interconnect architecture, comprising:

a plurality of wiring segments interconnected by a plurality of programmable switches, each of said programmable switches having two terminals, and each of said switches being characterized by a first programming state in which a low impedance bi-directional electrical connection is provided between said two terminals, and by a second programming state in which said two terminals are electrically disconnected, a plurality of speed-up circuits, said speed-up circuits each comprising a supply node, a ground node, a network node and circuitry, said circuitry providing means to detect a rising change exceeding a first predetermined threshold from a low logic level towards a high logic level on said network node, and providing means to provide a low impedance connection between said network node and said supply node for a first predetermined period of time, when said rising change occurs, said circuitry providing means to detect a falling change exceeding a second predetermined threshold from a high logic level towards a low logic level on said network node, and providing means to provide a low impedance connection between said network node and said ground node for a second predetermined period of time, when said falling change occurs, where at least some of said wiring segments of said routing network are each directly connected to a matching one of said network nodes of said speed-up circuits, where said first predetermined period of time is chosen longer than a first propagation delay required to charge said network node of a neighboring one of said plurality of speed-up circuits, through a series of at least one of said programmable switches in said first programming state, until a potential increase from an initial low logic level towards a high logic level exceeding said first predetermined threshold is achieved, and where said second predetermined period of time is chosen longer than a second propagation delay required to charge said network node of said neighboring one of said plurality of speed-up circuits, through said series of at least one of said programmable switches in said first programming state, until a potential decrease from an initial high logic level towards a low logic level exceeding said second predetermined threshold is achieved.

4. The programmable interconnect architecture in accordance with claim 3 wherein said circuitry of at least some of said speed-up circuits comprises:

a pull-up circuit having a supply terminal connected to said supply node, having a first input terminal connected to a first control node, and having a pull-up terminal connected to said network node, said pull-up circuit providing a low impedance electrical connection between said network node and said supply node if a first predetermined logic level is asserted on said first control node, a pull-down circuit having a ground terminal connected to said ground node, having a second input terminal connected to a second control node, and having a pull-down terminal connected to said network node, said pull-down circuit providing a low impedance electrical connection between said network node and said ground node if a second predetermined logic level is asserted on said second control node, a control circuit, having a third input terminal connected to said network node, having a first output terminal connected to said first control node, and having a second output terminal connected to said second control node, said control circuit providing means to detect said rising change exceeding said first predetermined threshold from a low logic level towards a high logic level on said network node, and providing means to assert said first logic level on said first control node for said first predetermined period of time when said rising change occurs, and said control circuit providing means to detect said falling change exceeding said second predetermined threshold from a high logic level towards a low logic level on said network node, and providing means to assert said second logic level on said second control node for said second predetermined period of time when said falling change occurs.

5. The programmable interconnect architecture in accordance with claim 4 wherein said control circuit comprises:

a first monostable circuit, having a fourth input terminal connected to said third input terminal of said control circuit, and having a third output terminal connected to said first control node, said first monostable circuit providing means to detect said rising change exceeding said first predetermined threshold from a low logic level towards a high logic level on said fourth input terminal, and providing means to assert said first logic level on said first control node for said first predetermined period of time when said rising change occurs, a second monostable circuit, having a fifth input terminal connected to said third input terminal of said control circuit, and having a fourth output terminal connected to said second control node, said second monostable circuit providing means to detect said falling change exceeding said second predetermined threshold from a high logic level towards a low logic level on said fifth input terminal, and providing means to assert said second logic level on said second control node for said second predetermined period of time when said falling change occurs.

6. The programmable interconnect architecture in accordance with claim 4 wherein said control circuit comprises:

an inverting delay circuit having a fourth input terminal connected to said network node and a third output terminal, a two-input logic AND circuit having a first input connected to said fourth input terminal of said inverting delay circuit, having a second input connected to said third output terminal of said inverting delay circuit, and having an output connected to said first control node, a two-input logic NOR circuit having a first input connected to said fourth input terminal of said inverting delay circuit, and having a second input connected to said third output terminal of said inverting delay circuit, and having an output connected to said second control node.

7. The programmable interconnect architecture of claim 3 wherein said integrated circuit further comprises at least one functional block chosen from the group consisting of user-programmable logic arrays, memories, microprocessors, digital signal processors, neural networks, solid-state displays, solid-state imagers, and telecommunications switching networks.

8. In an apparatus comprising a plurality of wiring nodes interconnected by a plurality of interconnection elements each having two terminals and providing a low resistance bi-directional electrical connection between said two terminals, a plurality of speed-up circuits, said speed-up circuits each comprising a supply node, a ground node, a network node and circuitry, said circuitry providing means to detect a rising change exceeding a first predetermined threshold from a low logic level towards a high logic level on said network node, and providing means to provide a low impedance connection between said network node and said supply node for a first predetermined period of time, when said rising change occurs, said circuitry providing means to detect a falling change exceeding a second predetermined threshold from a high logic level towards a low logic level on said network node, and providing means to provide a low impedance connection between said network node and said ground node for a second predetermined period of time, when said falling change occurs, where at least some of said wiring nodes are each directly connected to a matching one of said network nodes of said speed-up circuit, where said first predetermined period of time is chosen longer than a first propagation delay required to charge said network node of a neighboring one of said plurality of speed-up circuits, through a series of one or more of said interconnection elements, until a potential increase from an initial low logic level towards a high logic level exceeding said first predetermined threshold is achieved, where said second predetermined period of time is chosen longer than a second propagation delay required to charge said network node of said neighboring one of said plurality of speed-up circuits, through said series of one or more of said interconnection elements, until a potential decrease from an initial high logic level towards a low logic level exceeding said second predetermined threshold is achieved.

* * * * *